INVENTOR
CHARLES J. MORAN
BY: Oldham & Oldham
ATTORNEYS

INVENTOR
CHARLES J. MORAN
BY: Oldham & Oldham
ATTORNEYS

INVENTOR
CHARLES J. MORAN
BY:
Oldham & Oldham
ATTORNEYS

United States Patent Office 3,568,295

Patented Mar. 9, 1971

3,568,295

METHOD AND APPARATUS FOR ASSEMBLING ELECTRICAL COMPONENTS ONTO A CIRCUIT BOARD

Charles J. Moran, Cuyahoga Falls, Ohio, assignor to Goodyear Aerospace Corporation, Akron, Ohio Filed Aug. 14, 1968, Ser. No. 752,706
Int. Cl. B23q *17/00*
U.S. Cl. 29—407 4 Claims

ABSTRACT OF THE DISCLOSURE

The disclosure relates to the assembly of electrical or electronic components onto conventional printed circuit boards already having the printed circuit thereon with holes therethrough. The boards are placed on a moving conveyor which stops for predetermined intervals at various stations as it moves down the conveyor. A mask template is placed over the board at each individual station which indicates by the cutout portion of the mask and the color coding combination which components are to be placed by the individual at that station onto that portion of the printed circuit board. The mask is removed before the board moves on to the next station where a different mask adapted to cover the components placed on the board at the previous station has cut out portions of its own and color coding of its own so as to enable the placing of all of the components onto the printed circuit board in a minimum of time, and with a minimum possibility for mistake. In other words, a few components are placed on the board at each station by means of the mask template associated with that particular station. Upon the completion of the placing of the components upon the board, the components are temporarily held in position on the board, the electrical connectors to each component trimmed to proper spaced relationship through the holes, with the connectors then soldered into place, the temporary holding means removed, and the entire board cleaned for a final application into the necessary electrical or electronic circuit arrangement.

Heretofore, it has been known that there have been many and varied methods to make electrical printed circuit boards by automatic and semi-automatic techniques. However, the assembly of components onto these boards has not been automated to any extent so as to make the assembly thereof foolproof, efficient, low in cost, and yet highly reliable. The manual placing of electrical or electronic components onto a printed circuit board has been a time consuming and extremely tedious operation, and because of the complexity of the boards, and the miniaturization of the components, many mistakes normally are made because of human error. Ways and means for improving this manual technique are very much needed by the art, and means short of total automatic machine operation which are so terribly expensive are also needed by the field of electronic circuit board manufacture and assembly.

It is the general object of the present invention to meet the needs of the art by providing a semi-automated method and apparatus for mounting electrical or electronic components onto circuit boards which is much more reliable, faster, and less expensive than the totally manual method or the total machine method possible heretofore.

A further object of the invention is to provide an apparatus which provides mask templates associated with assembly stations along a moving conveyor which greatly facilitate the positioning of the electronic components onto the board, allow the assembly of the components onto the board to be accomplished by a plurality of persons with greatly reduced possibility of error, and in much less time than possible with a single person assembling the entire board.

A further object of the invention is to provide a process and apparatus which allows quick and accurate assembly of electrical components onto circuit boards, and the retention thereof onto the boards while soldering of the electrical leads from the components to the board takes place.

For a better understanding of the invention reference should be had to the accompanying drawings wherein.

Figure 1:
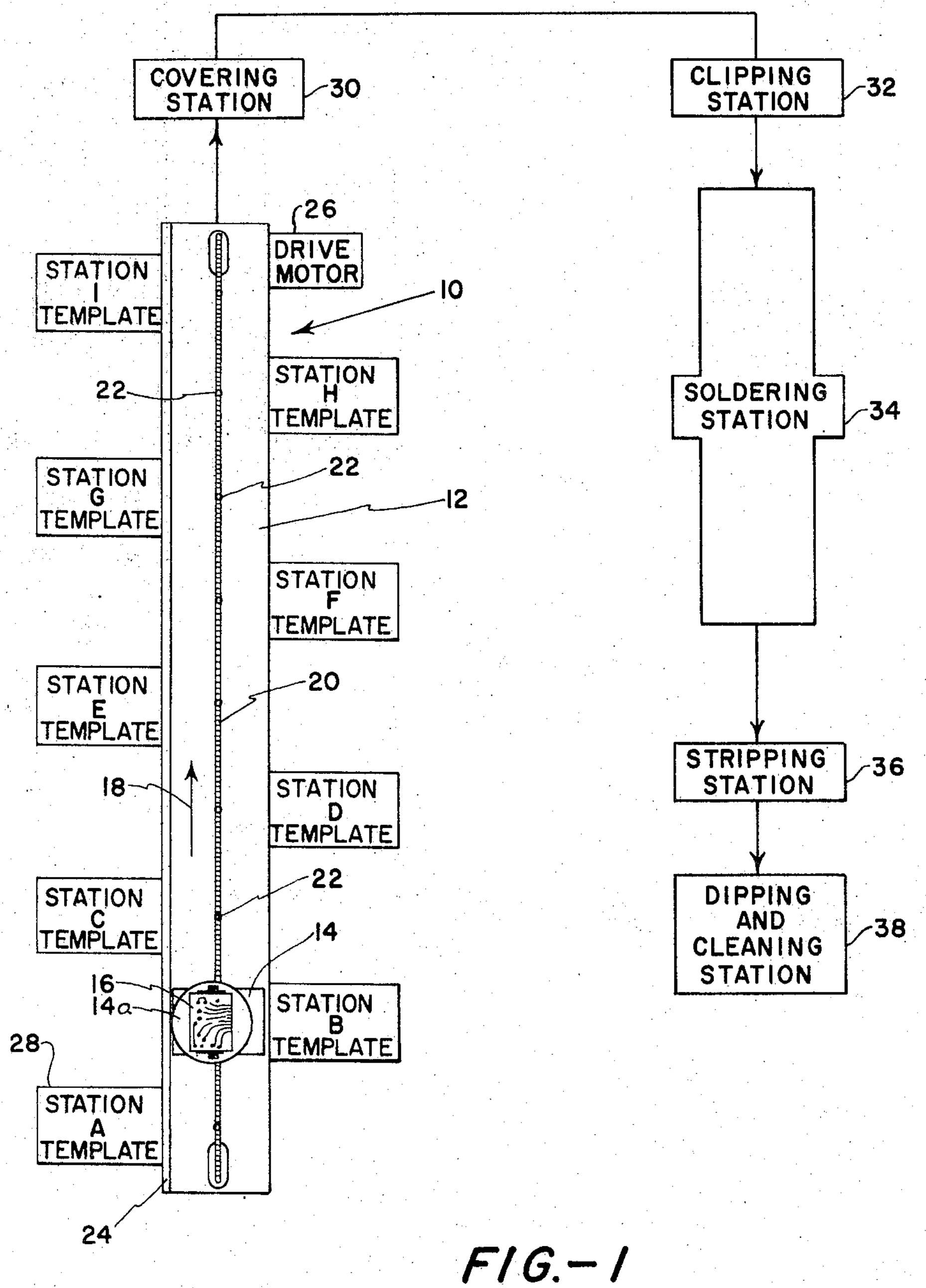
FIG. 1 is a block diagram schematic illustration of the various procedural steps and the structure associated therewith which are necessary to perform the assembly achieved by the invention.

With reference to the schematic form of the invention illustrated in FIG. 1 of the drawings, the numeral 10 indicates generally a table having a substantially flat bed 12 and a plurality of stations A through I alternately positioned in spaced relationship down each side of the table 10. A work platform is indicated generally by numeral 14 which carries a printed circuit board 16. The platform 14 is moved linearly down the table 10 in the direction of arrow 18 by means of an endless chain 20 and space pins 22 projecting vertically upwardly from and mounted to chain 20. The platform 14 contains a rotating bed **14*a* which abuts against a side wall 24 of the table 10. Hence, movement of the platform 14 down the table 10 causes rotation of bed 14*a* and hence proper positioning of the printed circuit board 16 at each of the stations as chain 20 moves in an intermittent fashion as driven by a suitable drive motor 26**.

The assembly of electronic components on the board 16, as it moves in intermittent fashion down the table, is accomplished by each station being provided with a particular template 28 associated respectively therewith. The operator positioned, for example, at station B places the template 28 over the board 16 with platform 14 in the position indicated. The individual then has components that are associated with the template available in suitable containers at the station, and places these components through slots on the template, with the component electrical leads placed through the holes in the circuit board, as will be more fully described hereinafter, while the platform 14 is stopped at station B. The template is then removed, the chain 20 drives again for a predetermined distance causing a 180° rotation of bed **14*a*. The chain 20 stops with board 16 in proper position in front of station C. The operator at station C then places template C in position and assembles the components associated therewith on the board. The same operation takes place at each succeeding station down the table 10**.

Naturally, it is to be understood that there are typically the same number of platforms 14 on the table at any one time as there are stations. However, only one platform 14 is indicated in FIG. 1 for the purposes of clarity, and explaining the sequential operation of the invention. When platform 14 has completed its interrupted path down the table 10 it is returned manually to start the path again with another board. The assembled board 16 is then sent to a covering station, indicated generally by block 30. At station 30, the board 16 is covered on the surface with some type of sheet material, to be more fully defined hereinafter, so as to hold the components positioned therein onto the board during the remainder of the processes. The next station, a clipping station indicated by block 32, actually clips off the excess length of the electrical leads from the components positioned through the holes on the board 16, and from here the board is sent on to a soldering station, indicated by block 34, where the clipped ends of the component leads are actually soldered to the board. A stripping station is now provided, as indicated by block 36, to strip the covering provided at station 30 from the board, and the final step of the process involves a dipping and cleaning station 38, where the board is preferably dipped into a liquid Freon solution for cleaning to complete the process.

Figure 2:
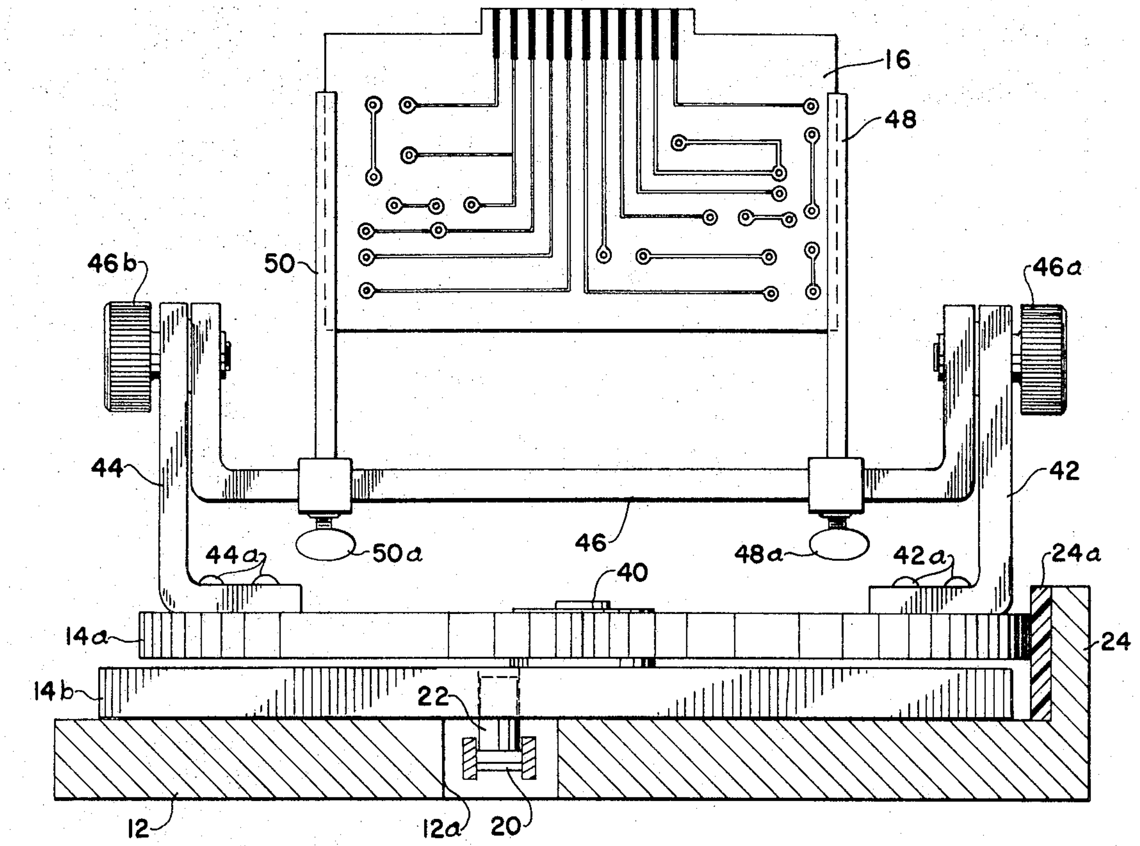
FIG. 2 is a vertical cross-sectional view of the board mounting apparatus of FIG. 1.

FIG. 2 more clearly illustrates the construction of platform 14. Essentially, it comprises a flat base **14*b* to which the bed 14*a* is rotatably mounted as by a pin 40. The printed circuit board 16 is removably carried by bed 14*a* by means of a pair of brackets 42 and 44 mounted to the bed by appropriate screws 42*a* and 44*a*, respectively. A U-shaped yoke 46 is supported by appropriate locking handles 46*a* and 46*b* on each end thereof. The handles 46*a* and 46*b* actually lock the yoke 46 in any desired angular relationship to brackets 42 and 44. A pair of arms 48 and 50 are slidably mounted to the center portion of yoke 46 and locked in place by appropriate thumbscrews 48*a* and 50*a*, respectively. The board 16 is slidably positioned in appropriate receiving slots in the arms 48 and 50, and held at any desired angular position by means of the adjustable securing with knobs 46*a* and 46*b*. The slidable relation of arms 48 and 50** allows lateral positioning for boards of different width.

The remainder of the structure in FIG. 2 illustrates the chain 20, the vertical upward position of pin 22, and how the chain rides in a slot **12*a* in surface 12 of table 10. Also, it should be seen that the side board 24 has a foam or other resilient covering 24*a* that engages in frictional relationship with the edge of bed 14*a* so as to provide the rotation thereof around pin 40**, as described with reference to FIG. 1 above.

Figure 3:
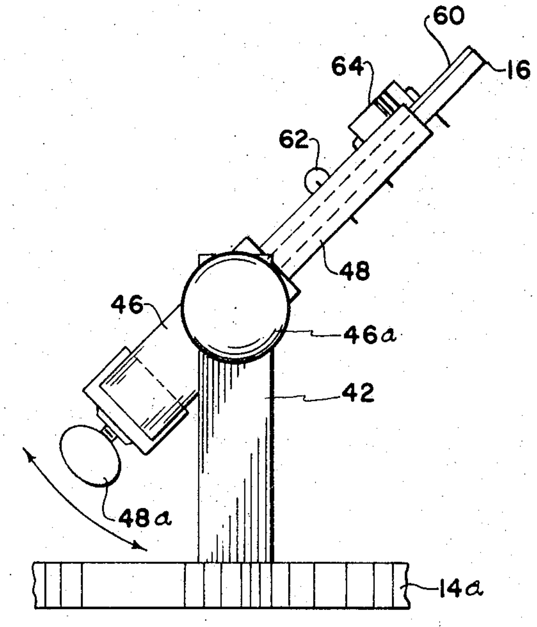
FIG. 3 is a side elevational view of the board mounting apparatus of FIG. 2.

FIG. 3 illustrates the preferred 45° angular relationship of the arms 48 and 50 in relation to the yoke 46 which facilitates positioning of the components onto the board 16. FIG. 3 also illustrates a template, indicated generally by numeral 60, positioned over board 16 with two components, 62 and 64, having their leads positioned through appropriate holes in the board.

Figure 4:
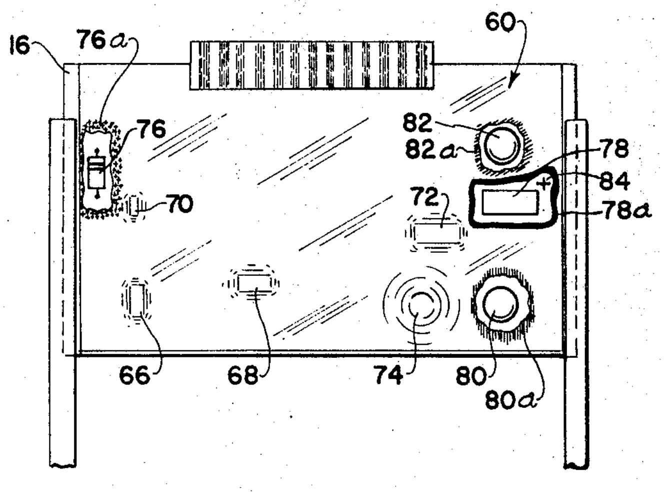
FIG. 4 is a front view of the board mounting apparatus of FIGS. 2 and 3 showing the mask template in position over the board and how the various components are either displayed or covered thereby.

FIG. 4 illustrates the template 60 in plan view showing the slots and configurations thereof. Specifically, the particular template 60 has contours formed thereon at points 66, 68, 70, 72, and 74 to fit over the other components which have been positioned on the circuit board 16, at previous stations in the assembly table 10. However, template 60 also illustrates its masking configuration by showing two rectangular holes at 76 and 78, and two circular holes at 80 and 82. Each of these respective holes through the template is aligned with appropriate small holes in the printed circuit board indicating where the leads from the component which is associated with that hole are supposed to pass. The operator of the station at which this particular template is utilized will have two long cylindrical components having electrical conductors out of each end, and two short, squat cylindrical components having a single conductor out of one end. Preferably, each of the respective holes on this template is color coded and has a color ring designated by the suffix "*a*" added to the respective number indicating the hole or slot through the template 60. Preferably, the color coding will be of the same color as the component, which will be positioned at that point on the circuit board. Also, since certain of the two conductor components must be positioned in proper electrical relationship to the board, a + indication associated with slot 78, as indicated by numeral 84, shows the operator at this station that the particular component associated with slot 78 should have its + end passing through the left hand hole, as seen in FIG. 4 of the drawings.

Figure 5:
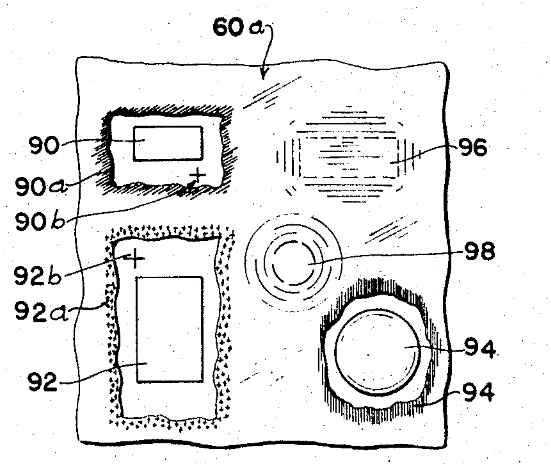
FIG. 5 is a greatly enlarged, broken away plan view of a board and mask template associated therewith.

FIG. 5 illustrates a slightly enlarged view of a separate mask **60*a* which might be associated with another station in the process. The mask 60*a* has two rectangular openings 90 and 92, and one circular opening 94. Raised preformed contours for components already on the board are provided at 96 and 98**, respectively. Appropriate color coding designated by suffix "*a*" is associated with each of the holes 90 through 94 in mask **60*a*. Each of the holes or slots 90 and 92 also have + signs 90*b* and 92*b***, respectively, associated therewith, for the reasons defined above with respect to FIG. 4.

Figure 6:
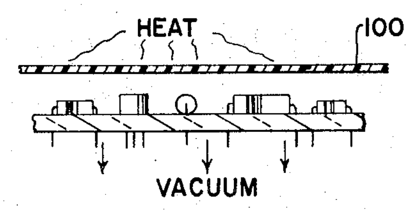
FIG. 6 is an enlarged, broken-away, vertical cross-sectional view of a board having the components assembled thereon illustrating how the components are retained in position by a retaining film.

FIG. 6 illustrates the covering stage or station of the invention which utilizes some type of plastic sheet 100 being draped under the influence of heat and sucked by a vacuum onto the top of and over the components positioned onto the printed circuit board. This step of the invention takes place after all the components have been positioned on the board utilizing the template and assembly technique outlined above. Essentially, any structure which will hold a piece of plastic film and apply vacuum to the bottom side of the circuit so as to suck the film down into close contacting relationship over the surface and thereby hold the components in their positioned relationship to the board will meet the process requirements for this station of the invention. This type of vacuum heat forming of a plastic sheet for holding articles to a board is well known in the packaging art.

Figure 7:
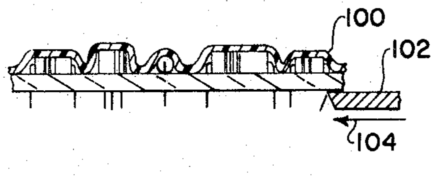
FIG. 7 illustrates the board of FIG. 6 with the components in place thereon showing how the electrical leads are cut off to a predetermined relationship with the board.

FIG. 7 illustrates the board and components of FIG. 6 with the plastic sheet 100 in position and showing a cutting bar 102 moving in the direction indicated by arrow 104. The bar 102 cuts off the connectors projecting through the board at the required distance so that soldering thereof can take place properly.

Figure 8:
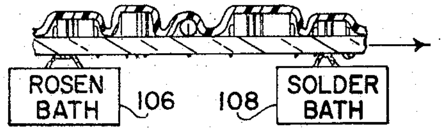
FIG. 8 illustrates the board of FIGS. 6 and 7 passing through the rosin and solder baths to solder the component leads to the board itself.

FIG. 8 illustrates the board of FIGS. 6 and 7 passing sequentially through a rosin bath 106 and a solder bath 108 which comprise part of the soldering station 34, to thereby solder the connectors in place to the printed circuit board, all in a manner well known and understood by those skilled in the art.

Figure 9:
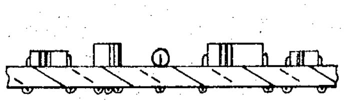
FIG. 9 illustrates the board of FIGS. 6, 7, and 8 in completed relationship with the retaining film removed.

FIG. 9 illustrates the circuit board in the completed condition with the plastic retaining film 100 removed, all the component leads soldered into position on the bottom side of the board, and after having been dipped and cleaned at the cleaning station 38.

Thus, it is seen that the objects of the invention have been achieved by providing a process and apparatus for positioning components on printed circuit boards with a combination of manual and mechanical techniques whereby the accuracy and speed of positioning is greatly enhanced by use of the specific and distinctive templates at each station which are color coded, and which indicate polarity for each of the components as necessary for each station. Also, the process utilizes unique steps for retaining the components on the board until welding or soldering has taken place.

While in accordance with the patent statutes only the best known embodiment of the invention has been illustrated and described in detail, it is to be particularly understood that the invention is not limited thereto or thereby, but that the inventive scope is defined in the appended claims.

What is claimed is:

1. A method to assemble electrical components onto a circuit board which comprises the steps of (1) moving the circuit board down a path with one face exposed, (2) stopping the board for short predetermined intervals of time at uniformly spaced stations along the path, (3) placing a mask template into intimate contact with and covering the board at each station to expose only those areas where components associated with that station are to be positioned, which templates are three dimensionally contoured to conform to the configuration of and cover any other components already positioned on the board and thereby properly orient the template in relation to the board, (4) positioning components on the board at each station at the locations where holes are provided in the template and removing the template before the board moves on to the next station, and (5) soldering the components into place on the board after the path through all the stations has been completed.

2. A method according to claim 1 including the step of providing a visual indication of which component is positioned through each hole in the mask template by including a preselected colored ring around each hole through the template.

3. A method according to claim 1 including the step of rotating the board 180° between each station along the path.

4. A method according to claim 3 including the step of covering and holding the components positioned on the board with a thin sheet of plastic heat and vacuum sealed into position before the soldering takes place.

References Cited

UNITED STATES PATENTS

| | | | |
|---|---|---|---|
| 2,959,848 | 11/1960 | Savitt | 29—407 |
| 3,088,197 | 5/1963 | Cargill | 29—430X |
| 3,216,101 | 11/1965 | Miller | 29—407 |
| 3,295,189 | 1/1967 | Hammell | 29—407X |
| 3,388,465 | 6/1968 | Johnston | 29—471.1X |
| 3,393,449 | 7/1968 | Garcia | 29—471.1X |

JOHN F. CAMPBELL, Primary Examiner

R. B. LAZARUS, Assistant Examiner

U.S. Cl. X.R.

29—424, 430, 471.1, 503